(12) United States Patent
Viehmann et al.

(10) Patent No.: US 7,573,328 B2
(45) Date of Patent: Aug. 11, 2009

(54) POWER AMPLIFIER

(75) Inventors: Hans-Heinrich Viehmann, Munich (DE); Christoph Braun, Munich (DE)

(73) Assignee: Infineon Technologies AG, Munich (DE)

( * ) Notice: Subject to any disclaimer, the term of this patent is extended or adjusted under 35 U.S.C. 154(b) by 113 days.

(21) Appl. No.: 11/670,173

(22) Filed: Feb. 1, 2007

(65) Prior Publication Data

US 2008/0186089 A1 Aug. 7, 2008

(51) Int. Cl.
*H03F 3/38* (2006.01)
(52) U.S. Cl. ......................................... 330/10; 330/251
(58) Field of Classification Search .................. 330/10, 330/207 A, 251
See application file for complete search history.

(56) References Cited

U.S. PATENT DOCUMENTS 6,707,337 B2 * 3/2004 Noro ........................... 330/10
7,262,658 B2 * 8/2007 Ramaswamy et al. ......... 330/10
2007/0210861 A1 * 9/2007 Chen ........................... 330/10
2008/0101628 A1 * 5/2008 Takagishi .................... 330/10

* cited by examiner

*Primary Examiner*—Khanh V Nguyen
(74) *Attorney, Agent, or Firm*—Dicke, Billig & Czaja, PLLC

(57) ABSTRACT

A power amplifier is disclosed. In one embodiment, the power amplifier is a Class-D Amplifier having a differential pulse width modulator is disclosed. The differential pulse width modulator has an input for receiving an input signal, a first output for outputting a first signal and a second output for outputting a second signal. A difference between the first signal and the second signal represents the pulse modulated signal. The differential pulse width modulator further has a comparator for comparing the first and second output signals. The comparator switches both the first and second output signal from a high state to a low state, if both the first and second output signals are in a high state.

24 Claims, 6 Drawing Sheets

TABLE

| OUPUT A | OUTPUT B | OUTPUT A' | OUTPUT B' |
|---|---|---|---|
| 0 | 0 | 0 | 0 |
| 0 | 1 | 0 | 1 |
| 1 | 0 | 1 | 0 |
| 1 | 1 | 0 | 0 |

TABLE

| OUPUT A | OUTPUT B | OUTPUT A' | OUTPUT B' |
|---|---|---|---|
| 0 | 0 | 0 | 0 |
| 0 | 1 | 0 | 1 |
| 1 | 0 | 1 | 0 |
| 1 | 1 | 0 | 0 |

Fig. 3

POWER AMPLIFIER

BACKGROUND

The present invention relates to power amplifiers.

Class-D amplifiers are power amplifiers having an input stage and an output stage. The output stages are conventionally operated in a switching mode. This means that the output stage is either switched on or switched off.

Conventionally, pulse width modulation is used in class-D Power Amplifiers. The (analogue digital) input signal is converted into a periodic sequence of pulses having a predetermined pulse frequency. The pulse width represents the amplitude of the input signal at one point in time. The pulse frequency is chosen to be at least twice as large as the maximum frequency of the input signal. Typically, the pulse frequency is ten or more times higher that the highest frequency of the input signal.

The pulse width modulated signal is input to high power switching device, which generates a high power replica of the pulse width modulated signal. This amplified pulse width modulated signal is fed to an integrator, which removes the high-frequency switching components of the PWM signal and recovers the input signal. In particular, class-D Power Amplifiers may be used for sound amplification. For this application, the output is fed to a loudspeaker. Class-D Audio amplifiers typically use switching frequencies greater than 100 kHz.

Conventionally, differential pulse width modulation is used in conventional Class-D Amplifiers. In this case, the differential pulse width modulator uses two modulated output signals for representing an input signal. The difference between the output signals is a pulse modulated signal encoding the input signal. Differential amplification has the advantage that interference on a single pulsed signal is cancelled in the case of differential amplification. However, energy consumption is increased, since two output signals instead of one output signal are generated. Consequently, the high frequency noise may cause the connected loudspeaker cable to transmit electromagnetic radiation. In this case, the loudspeaker cable acts as an antenna. This electromagnetic noise is unwanted, since it may affect electronic devices.

For these and other reasons, there is a need for the present invention.

SUMMARY

One embodiment provides an amplifier circuit with a pulse width modulator configured to receive an input signal and provide a first output signal and a second output signal, wherein a difference between the first output signal and the second output signal is a differential pulse modulated signal. In one embodiment, a comparator is configured to compare the first and second output signals, and switch the first and second output signal from a high state to a low state, if both the first and second output signals are in a high state.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates a table representing a switching of the first and second output signal generated by differential pulse width modulator of a Class-D amplifier according to one embodiment of the present invention.

DETAILED DESCRIPTION

Figure 1:
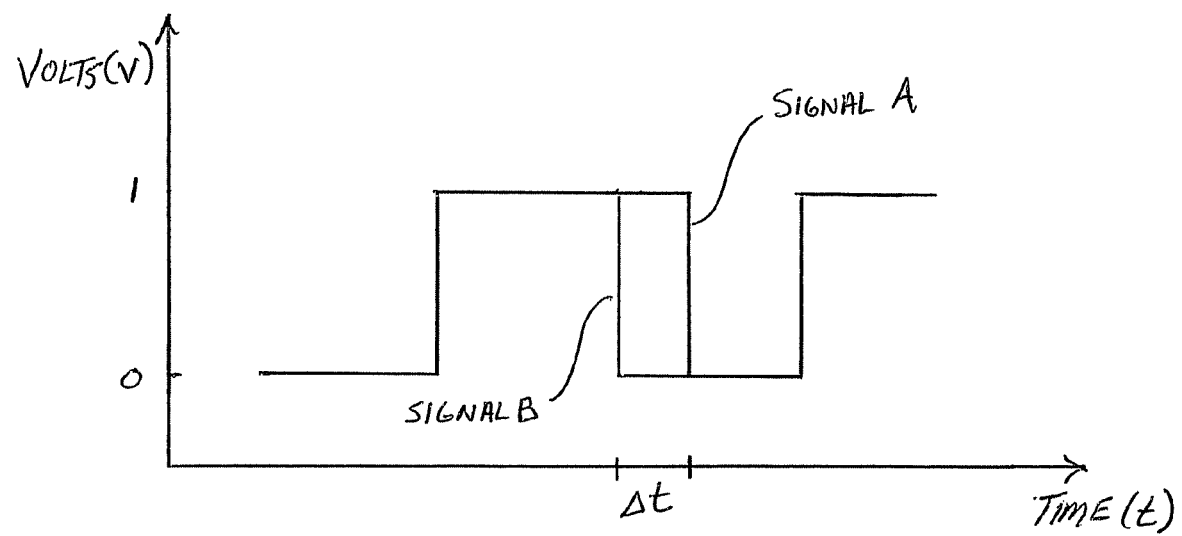
FIG. 1 illustrates a first diagram of a first output signal and a second output signal generated by a differential pulse width modulator of a conventional Class-D amplifier

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a Class-D Amplifier containing a differential pulse width modulator, which has an input for receiving an input signal, a first output A for outputting a first signal and a second output B for outputting a second signal. The difference between the first signal and the second signal is the pulse modulated signal output. The differential pulse width modulator includes a comparator for comparing the first and second output signals from the differential pulse width modulator. The comparator switches both the first and second output signal from a high state to a low state, if both the first and second output signals are in a high state. Thereby, the difference between the first and second output signals is not changed. This difference represents the encoded differential pulse modulated signal. Consequently, the resulting output signal of the class-D amplifier is not affected by recoding the output signals. Furthermore, the number of switching transitions of the first and second output signals is reduced. Power consumption of the output stages is in general higher during switching transitions than during high or low phases of the output signals. Consequently, the energy consumption of the output stage is reduced. Last but not least, high frequency noise is reduced. This noise is added to the output signals during high dc output phases. This time period is reduced.

The Class-D Amplifier may have a first output stage for amplifying the first output signal form the differential pulse width modulator and a second output stage for amplifying the second signal form the differential pulse width modulator. Both, the first and second output stage amplify the amplitude of the first and second output signal. This amplification determines eventually the amplification of the resulting class-D amplifier output.

A subtractor for subtracting the amplified second signal from the amplified first signal and outputting a subtraction signal is contained in the class D-Amplifier. Furthermore, the class-D amplifier may have an integrator for integrating the output subtraction signal from the subtractor.

One embodiment of the present invention is described hereinafter with regard to the appended drawings. The embodiment is merely exemplary. It shall not be construed in a manner limiting the scope of protection. The gist of the present invention is defined in the appended claims. The skilled person readily recognizes that the embodiment may be amended in many ways without departing from the scope of protection.

FIG. 1 illustrates a first signal A and a second signal B output by a differential pulse width modulator. The differential pulse width modulated signal is obtained by subtracting signal B from signal A. Both signal A and B are illustrated in a Cartesian coordinate system. The abscissa represents a voltage level B and the ordinate represents the time t.

Both signals A and B illustrated in FIG. 1 are pulsed signals, which change from a low voltage level to a high voltage level. It is apparent to the skilled person that different voltage levels may be used in order to provide a differential pulse width modulated signal. For most of the time signals A and B are identical. During time period $\Delta t$ the first signal A is larger than the signal B. The differential pulse width is defined by the voltage difference between signal A and B. Consequently, positive differential pulse having a width equal to the time period $\Delta t$ is represented by signals A and B. The differential pulse width may be modulated by adapting the pulse widths of signals A and B.

Figure 2:
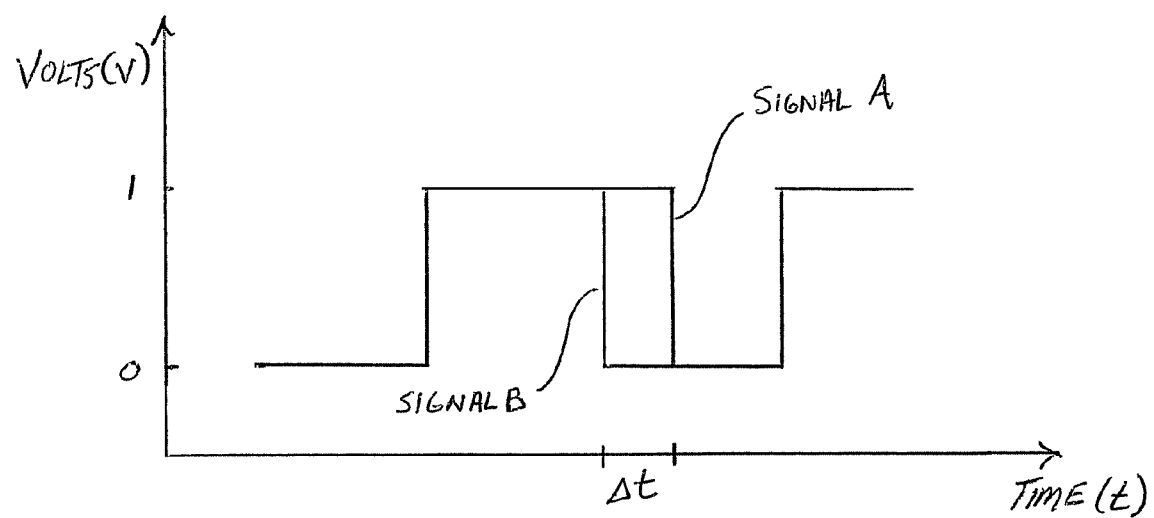
FIG. 2 illustrates a second diagram of a first and second output signal generated by a differential pulse width modulator of a conventional Class-D amplifier.

FIG. 2 illustrates a second exemplary diagram of a first and second output signal generated by a differential pulse width modulator of a conventional Class-D amplifier. Again signals A and B are illustrated as graphs in a Cartesian coordinate system. The abscissa represents the signals voltage and the ordinate the respective signal's moment in time. The graph of FIG. 2 may be obtained by interchanging signals A and B. In this case, signal B is larger than signal A during the time interval $\Delta t$. The resulting voltage difference obtained by subtracting signal B from signal A is a negative voltage pulse and a width equal to the time period $\Delta t$.

In order to obtain an amplified pulse width modulated signals both signals A and B are amplified using an amplifier. The amplified signals A and B are then subtracted from each other. High frequency noise is added to the signals during transition from a high level to a low level or from a low level to a high level. Furthermore, energy consumption is increased each time signals A and B are switched from high to low and vice versa.

The class-D amplifier according to one embodiment has reduced power consumption in relation to the state of the art. The table of FIG. 3 illustrates how output signals A and B are changed in order to reduce both the noise and power consumption of the class-D amplifier. Accordingly, outputs A and B are turned into outputs A' and B'. The voltage levels 0 V and 1 V are illustrated in the table. A comparator detects whether both outputs A and B have a high voltage level 1. In this case, the output voltages are both turned to the low voltage level 0 V. Otherwise, the voltage levels are signals A and B are not changed. Consequently, the difference between output signals A and B and switched output signals A' and B' is not changed. Both signal pair (A, B) and signal pair (A', B') represent the same differential voltage signal. However, the noise levels of signals A' and B' is lower. High frequency noise is added to the signals during signal transitions. The number of times signal transitions occur is reduced by at least one half in relation to the state of the art. Therefore, less noise is added to the amplified differential output. Furthermore, the number of signals transitions from high to low level is reduced. The number of transitions according to the embodiment is less than the number of transitions of the state of the art class-D amplifier divided by two. Therefore, the consecutive output stages amplifying the first and second output signals are switched less often. Consequently, the energy loss due to the switching of the amplifying stages is further reduced.

Figure 4:
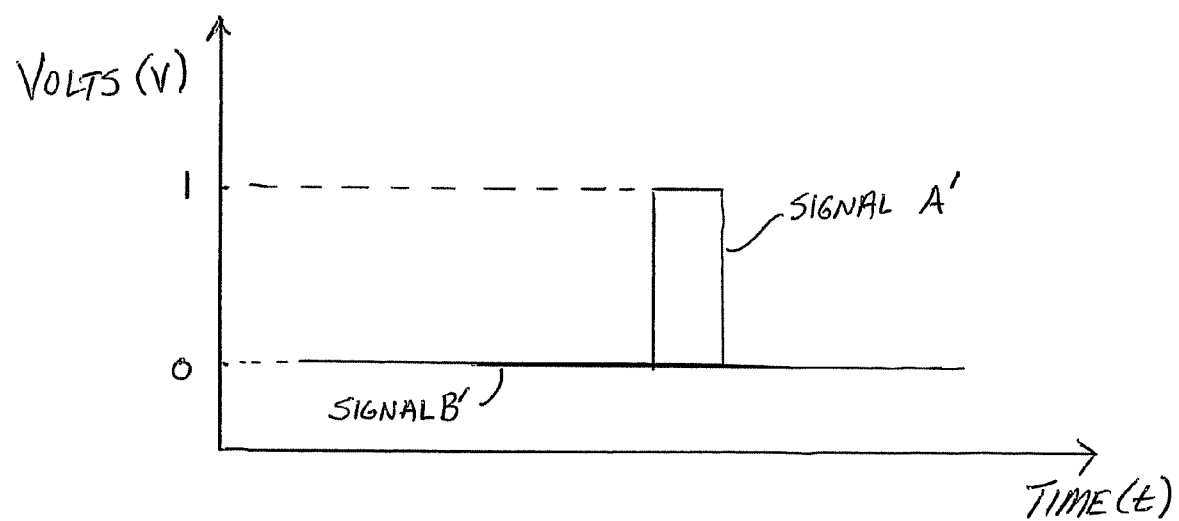
FIG. 4 illustrates first and second output signals output by the differential pulse width modulator of the Class-D amplifier according to one embodiment of the present invention.

FIG. 4 illustrates signals A' and B', which are output by a differential pulse width modulator of the present embodiment. Both signals A' and B' are represented in a Cartesian coordinate system, wherein the abscissa represents the voltage and the ordinate represents time. Signals A' and B' of FIG. 4 may be obtained by changing signals A and B of FIG. 1 according to the rule illustrated in FIG. 3. Whenever, signals A and B are equal to each other in FIG. 1, the corresponding signals A' and B' are equal to zero. Signal B' is equal to zero during the whole time in FIG. 4. Signal A is equal to 1 during the time interval $\Delta t$. Therefore, the resulting differential pulse modulated signal is the same as the positive signal pulse of signal A'.

Figure 5:
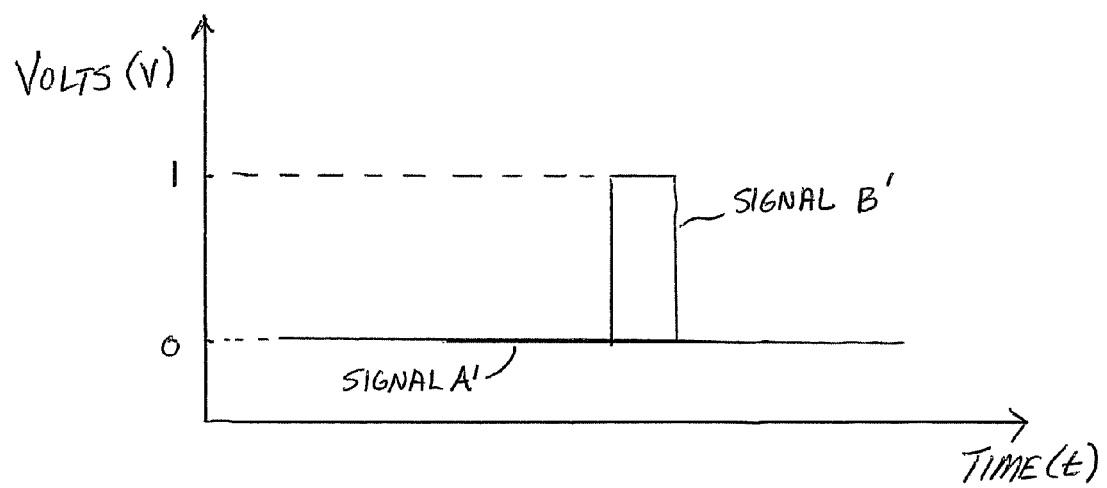
FIG. 5 illustrates further first and second output signals output by the differential pulse width modulator of the Class-D amplifier according to one embodiment of the present invention.

FIG. 5 illustrates signals A' and B', which are output by a differential pulse width modulator of the present embodiment. Both signals A' and B' are represented in a Cartesian coordinate system, wherein the abscissa represents the voltage and the ordinate represents time. Signals A' and B' of FIG. 4 may be obtained by changing signals A and B of FIG. 2 according to the rule illustrated in FIG. 3. The resulting differential pulse obtained by subtracting signal B from signal A is a negative pulse.

Figure 6:
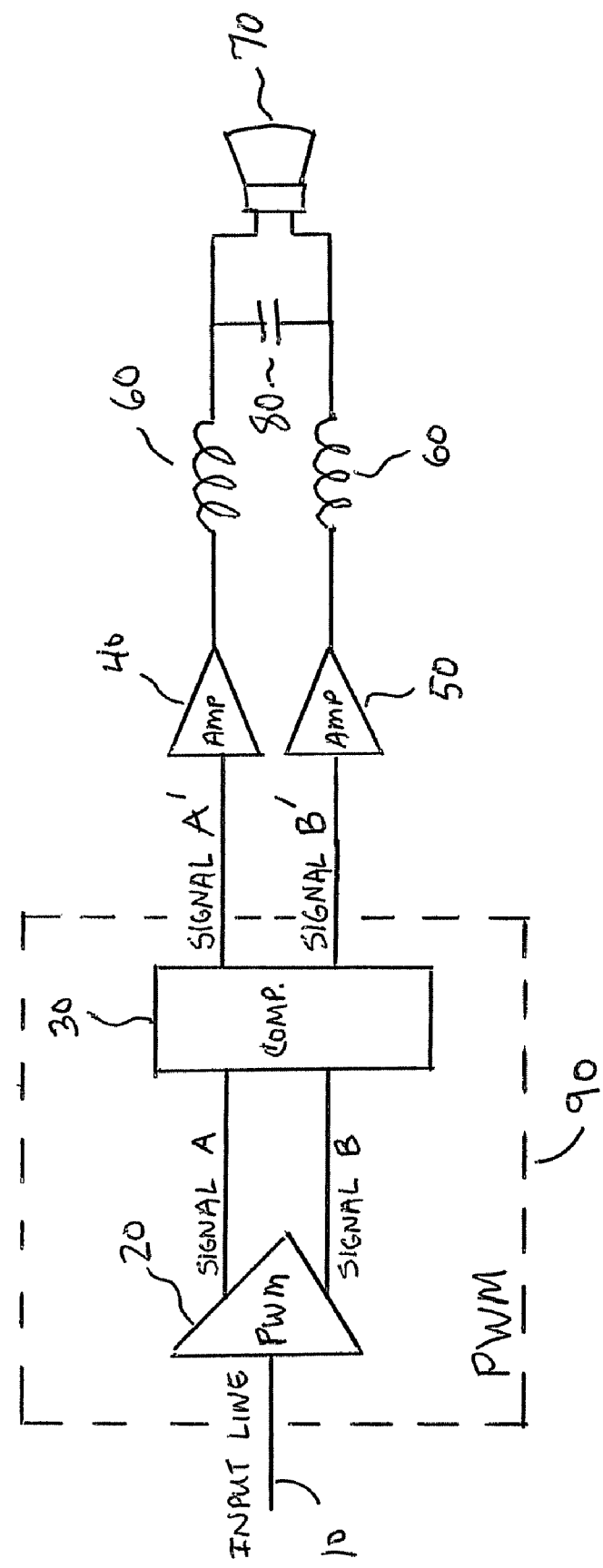
FIG. 6 illustrates one embodiment of the Class-D Amplifier according to the present invention.

FIG. 6 illustrates one embodiment of the Class-D Amplifier according to the present invention. The class-D Amplifier has an input line 10. The input line may provide a digital or analogue signal.

The class-D amplifier of FIG. 6 has a differential pulse width modulator 90, which provides two output signals A' and B'. The difference between signal A' and B' represents a pulse width modulated signal. The pulse width of the output signal encodes the amplitude of the input analogue signal at a certain point in time or the respective information encoded in the digital input signal. The first and second output signals A' and B' represent a train of pulses in themselves.

The differential pulse width modulator is adapted not to output two signals A' and B', which are simultaneously in a high state. Therefore, the differential pulse width modulator 90 has a pulse width modulation means 20 and a comparator 30. The pulse width modulation means 20 provides two pulse width modulated signals A and B to the comparator 30. Comparator effects the changes to signals A and B, which are indicated in the table of FIG. 3. If the signals A and B have a low voltage, then the resulting output signals A' and B' from the comparator correspond to the signals A and B. If output signals A and B disagree, then they are also left unchanged by the comparator. However, in case both output signals from the pulse width modulation means are in a high voltage state, the comparator outputs signals A' and B' in a low voltage state.

The function of the comparator 30 may be implemented using logical gates. In particular Inverters and AND-Gates may be chosen in the following way. $A'=(\neg B) \wedge A$ $B'=(\neg A) \wedge B$.

A and B represent the signals input to the comparator and A' and B' are the resulting signals output from the comparator. "¯" is a representation of logical NOT and "∧" represents an AND-Gate. It is apparent to the skilled person that other logical implementations are possible.

Both the first and second output signals A' and B' of the pulse width modulator 90 are amplified in a respective amplifier 40 and 50. The amplifiers may be implemented by transistors, in particular MOSFETS, which are operated as switches. This means, that the gate (or base) of the transistor receives the respective output signal A' or B'.

Two inductor coils 60 are further illustrated in FIG. 6. Both inductor coils have the same inductivity. The outputs of amplifiers 40 and 50 are each connected in series to one conductor 60. A loudspeaker 70 and a capacitor 80 are connected in parallel to each other. The capacitor 80 and inductors 60 form a low-pass filter. The voltage difference between the filtered output signals from the amplifiers 40 and 50 drives the loudspeaker 70

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An amplifier circuit comprising:
   a pulse width modulator configured to receive an input signal and provide a first output signal and a second output signal, wherein a difference between the first output signal and the second output signal is a differential pulse modulated signal; and
   a comparator configured to compare the first and second output signals and configured to switch the first and second output signal from a high state to a low state only when both the first and second output signals are in a high state.

2. The amplifier circuit of claim 1, comprising:
   an amplifier stage coupled to the comparator.

3. The amplifier circuit of claim 2, comprising:
   a low pass filter coupled to the amplifier stage.

4. The amplifier circuit of claim 3, comprising:
   a loudspeaker coupled to the low pass filter.

5. The amplifier circuit of claim 3, comprising:
   the low pass filter comprising an pair of inductors coupled to a capacitor.

6. The amplifier circuit of claim 4, comprising:
   a loudspeaker coupled in parallel with the capacitor.

7. The amplifier circuit of claim 1, comprising:
   the comparator providing a first differential output signal and a second differential output signal.

8. The amplifier circuit of claim 7, comprising:
   a first amplifier configured to amplify the first differential output signal; and
   a second amplifier configured to amplify the second differential output signal.

9. The amplifier circuit of claim 8, comprising:
   a first inductance coupled to the first amplifier; and a second inductance coupled to the second amplifier.

10. The amplifier circuit of claim 9, comprising:
    a capacitance coupled across the first inductance and the second inductance.

11. The amplifier circuit of claim 9, comprising:
    a loudspeaker coupled to the first inductance and the second inductance.

12. The amplifier circuit of claim 8, wherein the first amplifier and the second amplifier are implemented via transistors.

13. The amplifier circuit of claim 12, where the transistors are MOSFETs.

14. The amplifier circuit of claim 1, wherein the comparator comprises logic gates.

15. The amplifier circuit of claim 14, where the logic gates comprise NAND-Gates and AND-Gates.

16. A Class-D amplifier comprising:
    a differential pulse width modulator having an input for receiving an input signal and having a first output for outputting a first signal and a second output for outputting a second signal, wherein a difference between the first signal and the second signal comprises a pulse modulated signal output; and
    a comparator configured to compare the first and second output signals, the comparator configured to switch both the first and second output signals from a high state to a low state only if both the first and second output signals are in a high state.

17. The amplifier of claim 16, comprising:
    where the differential pulse width modulator includes the comparator.

18. The amplifier of claim 16, comprising:
    a first output stage for amplifying the first output signal from the differential pulse width modulator; and
    a second output stage for amplifying the second output signal form the differential pulse width modulator.

19. The amplifier of claim 16, wherein the comparator comprises logic gates.

20. The amplifier of claim 19, wherein the comparator comprises NAND-Gates and AND-Gates.

21. A method for driving a Class D amplifier, comprising:
    generating a first and second output signal, a difference between the first and second output signal representing a differential pulse width modulated signal; and
    comparing the first and second output signals, and switching both the first and second output signal from a high state to a low state, if both the first and second output signals are in a high state, and leaving both the first and second output signal in their respective states if either the first output signal or the second output signal or both the first and second output signals are in a low state.

22. The method of claim 21, further comprising:
    amplifying the first output signal form the differential pulse width modulator, and
    amplifying the second signal form the differential pulse width modulator.

23. The method of claim 22, further comprising:
    subtracting the amplified second signal from the amplified first signal and outputting a subtraction signal, and
    integrating the output subtraction signal.

24. An amplifier circuit comprising:
    a pulse width modulator configured to receive an input signal and provide a first output signal and a second output signal, wherein a difference between the first output signal and the second output signal is a differential pulse modulated signal; and
    means for comparing the first and second output signals; and
    means for switching the first and second output signals from a high state to a low state only if both the first and second output signals are in a high state.

* * * * *